United States Patent
Keil et al.

(10) Patent No.: US 9,804,241 B2
(45) Date of Patent: Oct. 31, 2017

(54) METHOD AND APPARATUS FOR MAGNETIC RESONANCE IMAGING

(71) Applicant: Siemens Aktiengesellschaft, Munich (DE)

(72) Inventors: Miriam Keil, Erlangen-Dechsendorf (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 479 days.

(21) Appl. No.: 14/595,708

(22) Filed: Jan. 13, 2015

(65) Prior Publication Data

US 2015/0198687 A1    Jul. 16, 2015

(30) Foreign Application Priority Data

Jan. 13, 2014   (DE) .................. 10 2014 200 403

(51) Int. Cl.
| | |
|---|---|
| *G01R 33/54* | (2006.01) |
| *G01R 33/28* | (2006.01) |
| *G01R 33/483* | (2006.01) |
| *G01R 33/56* | (2006.01) |

(52) U.S. Cl.
CPC .......... *G01R 33/546* (2013.01); *G01R 33/28* (2013.01); *G01R 33/4838* (2013.01); *G01R 33/5607* (2013.01)

(58) Field of Classification Search
CPC .. G01R 33/546; G01R 33/4838; G01R 33/28; G01R 33/5607
See application file for complete search history.

(56) References Cited

U.S. PATENT DOCUMENTS

| | | | |
|---|---|---|---|
| 4,715,383 A * | 12/1987 | Ehman ................ | G01R 33/561 324/309 |
| 5,532,596 A | 7/1996 | Henning | |
| 2015/0268319 A1 * | 9/2015 | Kirsch ............... | G01R 33/5607 324/309 |

* cited by examiner

*Primary Examiner* — G. M. Hyder
(74) *Attorney, Agent, or Firm* — Schiff Hardin LLP

(57) ABSTRACT

In a method and apparatus for magnetic resonance imaging, in order to enable improved saturation of magnetic resonance signals during an acquisition sequence, the acquisition sequence includes a readout block set with multiple readout blocks, a readout saturation pulse set with multiple readout saturation pulses, and an intermediate saturation pulse set with one or more intermediate saturation pulses, wherein the readout saturation pulse set is disjoint from the intermediate saturation pulse set, at least one readout block of the readout block set includes a readout saturation pulse of the readout saturation pulse set, and at least one intermediate saturation pulse of the intermediate saturation pulse set takes place between two successive readout blocks of the readout block set.

7 Claims, 3 Drawing Sheets

METHOD AND APPARATUS FOR MAGNETIC RESONANCE IMAGING

BACKGROUND OF THE INVENTION

Field of the Invention

The invention concerns a method for magnetic resonance imaging, as well as a magnetic resonance apparatus and a non-transitory, computer-readable data storage medium encoded with programming instructions that cause a computer to implement such a method.

Description of the Prior Art

In magnetic resonance imaging, the acquisition of magnetic resonance image data of an examination subject is implemented by operation of a magnetic resonance apparatus using acquisition sequences (magnetic resonance sequences). Acquisition sequences thereby often provide saturation of certain magnetic resonance signals by radiation of saturation pulses. The saturation typically produces a suppression of the outgoing magnetic resonance signals of a sub-region of an examination volume in the magnetic resonance image data.

SUMMARY OF THE INVENTION

An object of the invention is to provide an improved saturation of magnetic resonance signals during an acquisition sequence.

The invention encompasses a method for magnetic resonance imaging of an examination subject using an acquisition sequence which includes a readout block set that has multiple readout blocks, a readout saturation pulse set that has multiple readout saturation pulses and an intermediate saturation pulse set that has one or more intermediate saturation pulses. The readout saturation pulse set is disjoint from the intermediate saturation pulse set. At least one readout block of the readout block set includes a readout saturation pulse of the readout saturation pulse set. At least one intermediate saturation pulse of the intermediate saturation pulse set takes place between two successive readout blocks of the readout block set.

The examination subject can be a patient, a training volunteer or a phantom. The acquisition sequence is typically used by a magnetic resonance apparatus. An acquisition sequence is typically a pulse sequence.

A saturation pulse—meaning a readout saturation pulse of the readout saturation pulse set and/or an intermediate saturation pulse of the intermediate saturation pulse set—typically has the effect of dephasing a magnetization of nuclear spins in an examination volume. For this purpose, a saturation pulse can include a spoiler gradient. A saturation pulse is localized saturation pulse, which dephases the magnetization only in a sub-region of the examination volume, and thus suppresses the magnetic resonance signals acquired from that sub-region. The application of a regional saturation pulse thus leads to the situation that the sub-region produces a reduced signal (advantageously no signal) in the acquired magnetic resonance images. A localized saturation pulse is thus particularly suitable for avoiding movement artifacts of the sub-region. The condition that the readout saturation pulse set is disjoint from the intermediate saturation pulse set means that no saturation pulse is both part of the readout saturation pulse set and part of the intermediate saturation pulse set.

A readout block of the readout block set typically includes a readout window which includes the activation of a reception device for the magnetic resonance signals—for example of an ADC (analog/digital converter)—that is coupled to the reception coils of the magnetic resonance apparatus. The readout block furthermore typically includes an excitation pulse to excite the magnetization in the measurement volume. An excitation pulse thereby typically ensures that a magnetic resonance signal can be read out of an examination region. The readout block furthermore possibly includes at least one refocusing pulse to refocus the magnetization in the measurement volume. The excitation pulse thereby typically takes place at the start of the readout block. The refocusing pulses and readout window then typically take place in alternation after an excitation of the magnetization has taken place by means of the excitation pulse. The readout block can include an entire echo train within the scope of a turbo spin echo acquisition. During the readout block, one or more k-space lines of one or more slices or 3D volumes of a magnetic resonance image are typically acquired.

The procedure in accordance with the invention is based on the insight that an incomplete saturation of the tissue signals is often present in the case of conventional acquisition sequences. This leads to unwanted signal inhomogeneities and/or to an insufficient saturation of the tissue signals (meaning a presence of a residual signal) in the magnetic resonance images acquired by means of conventional acquisition sequences. The unsaturated residual signal can lead to an intensification of artifacts (for example due to movement of the examination subject) in the acquired magnetic resonance images. The reason for the insufficient saturation of the tissue signals is that, in conventional acquisition sequences, only one readout saturation pulse of the readout saturation pulse set is present. The at least one readout saturation pulse thereby preferably takes place at the start of the at least one readout block of the readout block set. In particular, the data acquisition of the at least one readout block then takes place immediately following the at least one readout saturation pulse.

Specific acquisition sequence, such as T2-weighted turbo spin echo sequences, thereby provide a long wait time between the readout blocks of the readout block set. The wait time is thereby typically determined by the desired application and/or the desired contrast. For example, due to the acquisition sequence, long repetition times must be present between the echo trains during the readout blocks. Long time periods therefore typically also exist between the readout saturation pulses of the readout saturation pulse set since these typically take place at the beginning of the readout blocks. In conventional acquisition sequences, the tissue signal to be suppressed has by then relaxed back again due to the long wait time between the application of the readout saturation pulses, and therefore is not completely saturated. The incomplete saturation of the tissue signals in the magnetic resonance images therefore results, and thus the reduced image quality of the magnetic resonance images acquired by means of conventional acquisition sequences.

Because the proposed acquisition sequence in accordance with the invention provides one or more intermediate saturation pulses of the intermediate saturation pulse set, in addition to the readout saturation pulses of the readout saturation pulse set, this advantageously leads to a saturation of the tissue signals that is improved relative to conventional acquisition sequences. A readout of the magnetic resonance signals does not immediately follow after an intermediate saturation pulse of the intermediate saturation pulse set. Instead, another readout saturation pulse of the readout saturation pulse set takes place in the acquisition sequence after the intermediate saturation pulse and before a readout of the magnetic resonance signals. The intermediate saturation pulses of the intermediate saturation pulse set are additional saturation pulses, which are executed during the wait times between two readout blocks of the readout block set. The at least one intermediate saturation pulse takes place after the end of the chronologically first readout block of the two successive readout blocks, and before the beginning of the chronologically second readout block of the two successive readout blocks.

The repeated execution of the saturation pulses—in particular of the intermediate saturation pulses and readout saturation pulses—then leads to an intensification of the effectiveness of the saturation pulses. The intermediate saturation pulse preferably leads to a pre-saturation of the of the tissue signals, and thus already to a sufficient saturation of the tissue signals at the beginning of the data acquisition during a readout block. The magnetic resonance images acquired by means of such an acquisition sequence thus have a more homogeneous or more distinct saturation of the tissue signals—in particular across all slices of the magnetic resonance images—relative to magnetic resonance images acquired by means of conventional acquisition sequences. No extension of the measurement time is thereby necessary. The acquisition sequence according to the invention is advantageous when a high repetition rate of saturation pulses is required, for example if asymmetrical saturation pulses are used.

In an embodiment, a repetition time elapses between the beginning of the two successive readout blocks of the readout block set, wherein half of this repetition time elapses between the beginning of the chronologically first readout block of the two successive readout blocks of the readout block set and the at least one intermediate saturation pulse of the intermediate saturation pulse set. In particular, precisely one half of the repetition time between those events. The at least one intermediate saturation pulse thus essentially takes place in the chronological middle between the two successive readout blocks. The at least one intermediate saturation pulse can thus lead to a sufficient saturation of the tissue signals.

In another embodiment, a repetition time elapses between the beginning of the two successive readout blocks of the readout block set, and a duration that is longer than half of the repetition time and shorter than the repetition time elapses between the beginning of the chronologically first readout block of the two successive readout blocks of the readout block set and the at least one intermediate saturation pulse of the intermediate saturation pulse set. In particular, this duration is shorter than the repetition time by at least 100 ms, advantageously by at least 200 ms, most advantageously by at least 300 ms. The time interval between the at least one intermediate saturation pulse and the beginning of the chronologically second readout block of the two successive readout blocks is thus markedly longer than the time interval between the readout saturation pulse and the data acquisition of the chronologically second readout block of the two successive readout blocks. The time period between the at least one intermediate saturation pulse and the readout saturation pulse of the chronologically second readout block of the two successive readout blocks is thus shorter than the time period between the at least one intermediate saturation pulse and the readout saturation pulse of the chronologically first readout block of the two successive readout blocks. The at least one intermediate saturation pulse can thus produce an advantageous saturation of the tissue signals for the readout block following the at least one intermediate saturation pulse.

In another embodiment, the intermediate saturation pulse set includes multiple intermediate saturation pulses, wherein at least two intermediate saturation pulses of the intermediate saturation pulse set occur between the two successive readout blocks of the readout block set. The at least one intermediate saturation pulse is thus executed repeatedly between the two successive readout blocks of the readout block set. The at least two intermediate saturation pulses preferably occur in a chronologically irregular pattern. The repetition of the at least one intermediate saturation pulse is advantageous when a high repetition rate of saturation pulses is required, in particular if asymmetrical saturation pulses are used.

In another embodiment, the readout saturation pulses of the readout saturation pulse set and the intermediate saturation pulses of the intermediate saturation pulse set are similar. In particular, the readout saturation pulses of the readout saturation pulse set and the intermediate saturation pulses of the intermediate saturation pulse set have the same parameters, for example the same flip angle. The readout saturation pulses of the readout saturation pulse set and the intermediate saturation pulses of the intermediate saturation pulse set are thus identical sequence objects, in particular with regard to the sequence programming. The readout saturation pulses of the readout saturation pulse set and the intermediate saturation pulses of the intermediate saturation pulse set therefore differ only with regard to their time position within the acquisition sequence, in particular with regard to the readout blocks of the readout block set.

Naturally, the readout saturation pulse set can include multiple different readout saturation pulses which, for example, saturate the tissue signals of different slices. The multiple different readout saturation pulses can then take place in succession or simultaneously at the beginning of the readout blocks of the readout block set. If this is the present case, the intermediate saturation pulse set advantageously likewise includes multiple different intermediate saturation pulses which then respectively correspond to the different readout saturation pulses of the readout saturation pulse set, i.e. are respectively similar to the different readout saturation pulses of the readout saturation pulse set.

The magnetic resonance apparatus according to the invention has a control device that is designed to operate the apparatus in order to execute a method according to the invention. With the control device, the magnetic resonance apparatus can thus execute a method for magnetic resonance imaging of an examination subject using an acquisition sequence as described above.

For this purpose, the control device has a saturation pulse generator which is designed to generate a readout saturation pulse set with multiple readout saturation pulses and an intermediate saturation pulse set with one or more intermediate saturation pulses. Furthermore, the control device has a readout module which is designed to generate a readout block set with multiple readout blocks. The readout module and the saturation pulse generator operate in coordination such that the readout saturation pulse set is disjoint from the intermediate saturation pulse set, at least one readout block of the readout block set includes a readout saturation pulse of the readout saturation pulse set, and at least one intermediate saturation pulse of the intermediate saturation pulse set takes place between two successive readout blocks of the readout block set.

In an embodiment, the readout module and the saturation pulse generator operate in coordination such that a repetition time elapses between the beginning of the two successive readout blocks of the readout block set, wherein half of the repetition time elapses between the beginning of the chronologically first readout block of the two successive readout blocks of the readout block set and the at least one intermediate saturation pulse of the intermediate saturation pulse set.

In another embodiment, the readout module and the saturation pulse generator operate in coordination such that a repetition time period elapses between the beginning of the two successive readout blocks of the readout block set, wherein a duration that is longer than half the repetition time period and shorter than the repetition time period elapses between the beginning of the chronologically first readout block of the two successive readout blocks of the readout block set and the at least one intermediate saturation pulse of the intermediate saturation pulse set.

In another embodiment, the readout module and the saturation pulse generator operate in coordination such that the intermediate saturation pulse set includes multiple intermediate saturation pulses, wherein at least two intermediate saturation pulses of the intermediate saturation pulse set take place between the two successive readout blocks of the readout block set.

In another embodiment, the readout module and the saturation pulse generator operate in coordination such that the readout saturation pulses of the readout saturation pulse set and the intermediate saturation pulses of the intermediate saturation pulse set are similar.

The control device can have additional control components that are necessary and/or advantageous for execution of a method according to the invention. The control device can also be designed to send control signals to the magnetic resonance apparatus and/or to receive and/or process control signals in order to execute a method according to the invention. Computer programs and additional software by means of which a processor of the control device automatically controls and/or executes a method workflow of a method according to the invention can be stored in a memory unit of the control device. The control device can be integrated into the magnetic resonance apparatus. The control device can also be installed separately from the magnetic resonance apparatus. The control device can be connected with the magnetic resonance apparatus. The magnetic resonance apparatus according to the invention thus enables an acquisition of magnetic resonance images by means of an acquisition sequence, wherein the magnetic resonance images have a particularly homogeneous saturation of tissue signals, and thus a high image quality.

The present invention also encompasses a non-transitory, computer-readable data storage medium encoded with programming instructions that, when the storage medium is loaded into a computerized control and processing system of a magnetic resonance apparatus, cause the computerized control and processing system to operate the magnetic resonance apparatus so as to execute any or all embodiments of the method described above.

The computer must thereby respectively have the requirements (for example a corresponding working memory, a corresponding graphics card or a corresponding logic unit) so that the respective method steps can be executed efficiently. Examples of electronically readable data media are a DVD, a magnetic tape or a USB stick on which is stored electronically readable control information. All embodiments according to the invention of the method described in the preceding can be implemented when this control information is read from the data medium and stored in a controller and/or control device of a magnetic resonance apparatus.

The advantages of the magnetic resonance apparatus according to the invention and of the storage medium according to the invention essentially correspond to the advantages of the method according to the invention described above. The corresponding functional features of the method are thereby developed by corresponding objective modules, in particular hardware modules.

DESCRIPTION OF THE PREFERRED EMBODIMENTS

Figure 1:
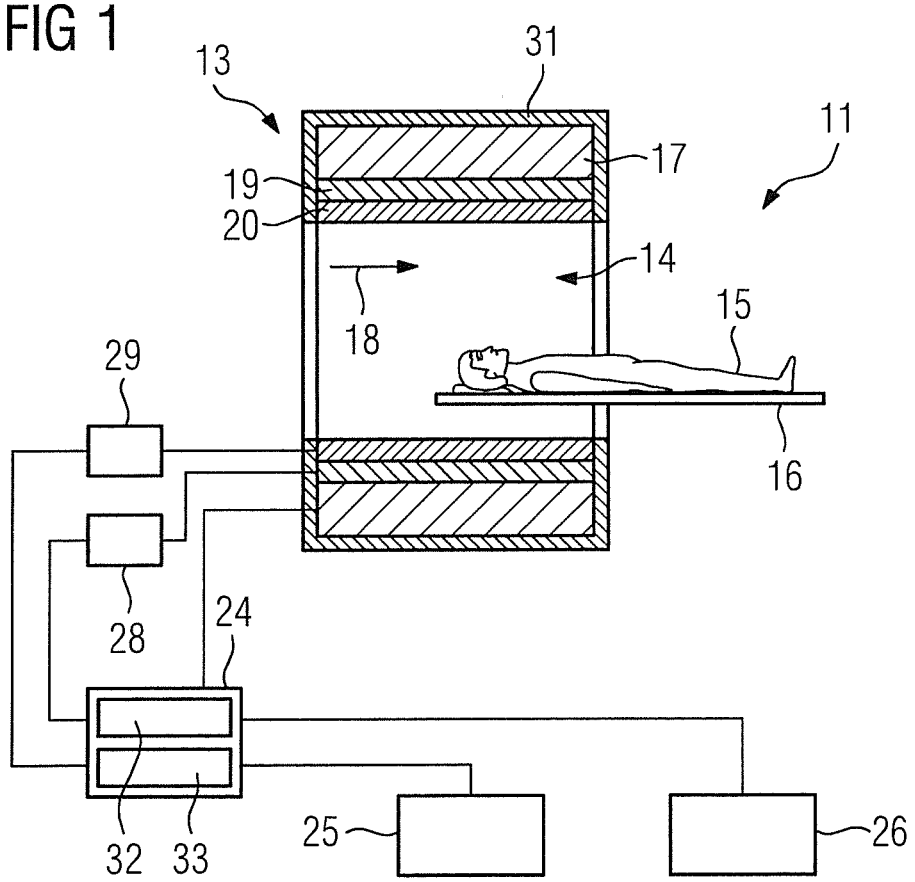
FIG. 1 schematically illustrates a magnetic resonance apparatus according to the invention for execution of a method according to the invention.

FIG. 1 schematically shows a magnetic resonance apparatus 11 according to the invention. The magnetic resonance apparatus 11 has a detector unit or scanner (formed by a magnet unit 13) with a basic field magnet 17 to generate a strong and constant basic magnetic field 18. The magnetic resonance apparatus 11 also has a cylindrical patient acquisition region 14 for accommodation of a patient 15. The patient acquisition region 14 is cylindrically enclosed by the magnet unit 13 in a circumferential direction. The patient 15 can be slid into the patient acquisition region 14 by a patient support device 16 of the magnetic resonance apparatus 11. For this purpose, the patient support device 16 has a patient table that is movable within the magnetic resonance apparatus 11. The magnet unit 13 is externally shielded by a housing casing 31 of the magnetic resonance apparatus.

Furthermore, the magnet unit 13 has a gradient coil unit 19 to generate magnetic field gradients that are used for a spatial coding during an imaging. The gradient coil unit 19 is controlled by a gradient coil unit 28. Furthermore, the magnet unit 13 has a radio-frequency antenna unit 20 (which, in the shown example, is designed as a body coil permanently integrated into the magnetic resonance apparatus 10) and a radio-frequency antenna control unit 29, for an excitation of nuclear spins in the patient so as to deflect (flip) the nuclear spins from the polarization that arises in the basic magnetic field 18 generated by the basic magnet 17. The radio-frequency antenna unit 20 is controlled by the radio-frequency antenna control unit 29 and radiates radio-frequency pulses into an examination space that is essentially formed by the patient acquisition region 14. Furthermore, the radio-frequency antenna unit 14 is designed to receive magnetic resonance signals, in particular from the patient 15.

The magnetic resonance apparatus 11 has a central control device 24 that operates the basic magnet 17, the gradient coil unit 28 and the radio-frequency antenna control unit 29. The central control device 24 controls the overall operation of the magnetic resonance apparatus 11, for example the implementation of a predetermined imaging gradient echo sequence. Control information (for example imaging parameters) and reconstructed magnetic resonance images can be displayed for a user at a display unit 25 (for example on at least one monitor) of the magnetic resonance apparatus 11. In addition, the magnetic resonance apparatus 11 has an input unit 26 by which information and/or parameters can be entered by a user during a measurement process. The control device 24 can include the gradient control unit 28 and/or radio-frequency antenna control unit 29 and/or the display unit 25 and/or the input unit 26.

The control device 24 has a saturation pulse generator 32 that is designed to generate a readout saturation pulse set with multiple readout saturation pulses and an intermediate saturation pulse set with one or more intermediate saturation pulse. Furthermore, the control device 24 has a readout module 33 which is designed to generate a readout block set with multiple readout blocks. For this purpose, the saturation pulse generator 32 and the readout module 33 can pass control signals to the gradient control unit 28 and the radio-frequency antenna control unit 29. Together with the control device 24, the magnetic resonance apparatus 11 is thus designed to execute a method according to the invention.

The shown magnetic resonance apparatus 11 can naturally have additional components that magnetic resonance apparatuses conventionally have. The general functionality of such magnetic resonance apparatuses is known to those skilled in the art, so that a detailed description of the additional components is not necessary herein.

Figure 2:
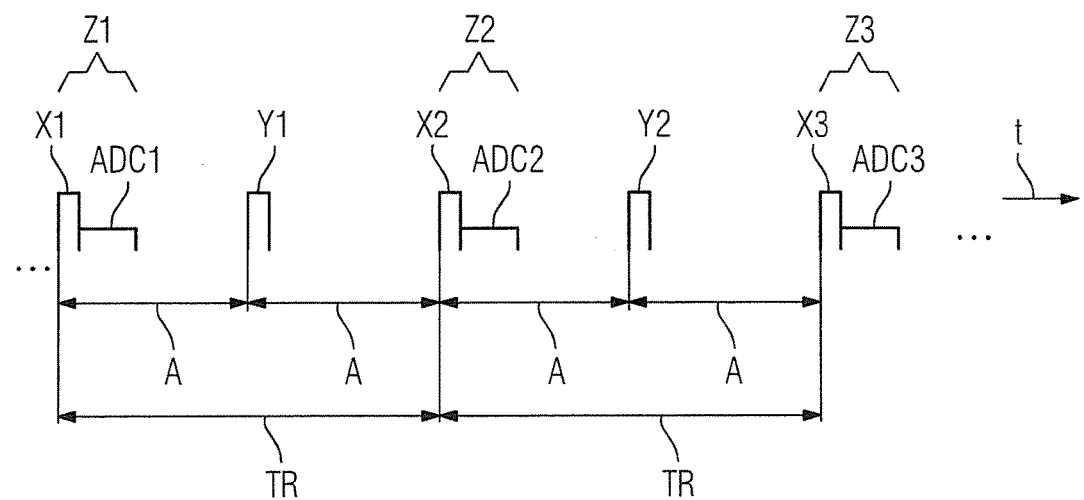
FIG. 2 shows an acquisition sequence according to a first embodiment of a method according to the invention.

FIG. 2 shows an acquisition sequence according to a first embodiment of a method according to the invention. Thereby shown is a time segment of the acquisition sequence which includes two repetition time periods TR and a part of the third repetition time period TR of the acquisition sequence. Naturally, the sequence workflow can repeat cyclically during a repetition time period TR of the acquisition sequence, in particular until all slices and/or the entirety of k-space of the desired magnetic resonance images are acquired.

The shown segment of the acquisition sequence includes a readout block set with three readout blocks Z1, Z2, Z3 which are generated by the readout module 33. Furthermore, the shown segment of the acquisition sequence includes a readout saturation pulse set with three readout saturation pulses X1, X2, X3 that are generated by the saturation pulse generator 32. Each readout block Z1, Z2, Z3 includes one of the readout saturation pulses X1, X2, X3 and an echo train ADC1, ADC2, ADC3 immediately following the readout saturation pulse X1, X2, X3, during which echo train a readout of the magnetic resonance signals occurs after an excitation of an examination volume of the patient 15. The first readout block Z1 thus includes the first readout saturation pulse X1 and the first echo train ADC1 immediately following this etc.

Furthermore, the shown segment of the acquisition sequence includes an intermediate saturation pulse set with two intermediate saturation pulses Y1, Y2 which are likewise generated by the saturation pulse generator 32. The readout saturation pulse set is disjoint from the intermediate saturation pulse set. Furthermore, the readout saturation pulses of the readout saturation pulse set and the intermediate saturation pulses of the intermediate saturation pulse set are similar. For example, the readout saturation pulses of the readout saturation pulse set and the intermediate saturation pulses of the intermediate saturation pulse set have the same parameters. The readout saturation pulses and the intermediate saturation pulses are designed as localized saturation pulses, for example.

The first shown repetition time period TR of the acquisition sequence begins with the first readout block Z1, in particular with the first readout saturation pulse X1 of the first readout block Z1. During the first readout block Z1, the first echo train ADC1 then occurs at the first readout saturation pulse Z1. After the end of the first readout block Z1, a wait period occurs until the end of the first repetition time period TR. The second repetition time period TR that follows this then begins with the second readout block Z2 which includes the second readout saturation pulse X2 and the second echo train ADC2. After the end of the second repetition time period TR, the third readout block Z3 then occurs with the third readout saturation pulse X3 and the third echo train ADC3. A repetition time period thus elapses between the beginning of two successive readout blocks among the readout blocks Z1, Z2, Z3.

Intermediate saturation pulses Y1, Y2 of the intermediate saturation pulse set respectively occur between the aforementioned two successive readout blocks among the readout blocks Z1, Z2, Z3 of the readout block set. The first intermediate saturation pulse Y1 thus occurs during the wait period of the first repetition time period TR, after the end of the first readout block Z1 but still before the beginning of the second readout block Z2. The second intermediate saturation pulse Y2 occurs during the wait period of the second repetition time period TR, after the end of the second readout block Z2 but still before the beginning of the third readout block Z3. As shown in FIG. 2, half of a repetition time period A elapses between the beginning of the first readout block Z1 (in particular the first readout saturation pulse X1) and the first intermediate saturation pulse Y1. The other half of a repetition time period consequently elapses between the first intermediate saturation pulse Y1 and the beginning of the second readout block Z2. The same applies to the second intermediate saturation pulse Y2 with regard to the second readout block Z2 and the third readout block Z3.

Figure 3:
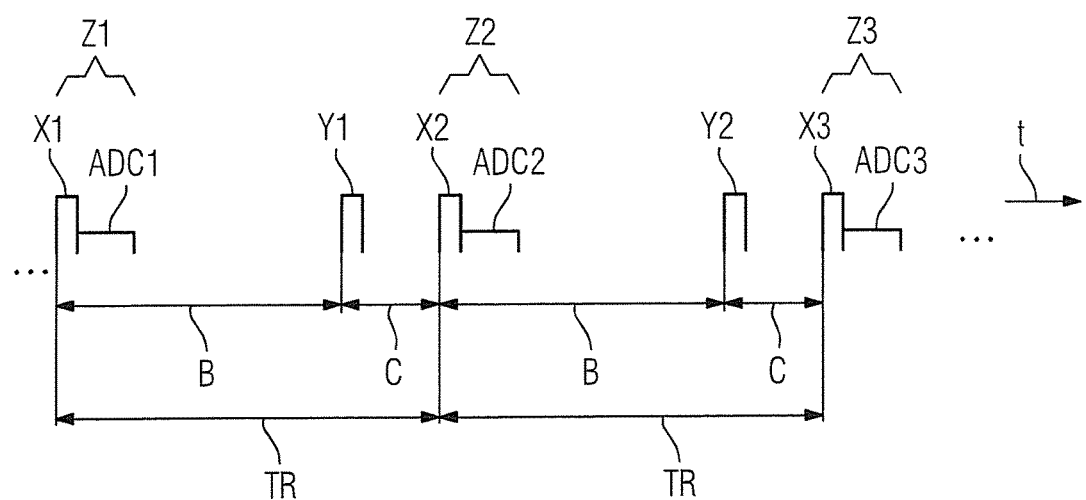
FIG. 3 shows an acquisition sequence according to a second embodiment of a method according to the invention.

FIG. 3 shows an acquisition sequence according to a second embodiment of a method according to the invention. The section of the acquisition sequence of FIG. 3 includes the same elements as the section of the acquisition sequence from FIG. 2. However, a duration B which is longer than the half repetition time period A elapses between the beginning of the first readout block Z1 (in particular the first readout saturation pulse X1) and the first intermediate saturation pulse Y1. An additional duration C which is shorter than half of the repetition time period A thus consequently elapses between the first readout saturation pulse Y1 and the beginning of the second readout block Z2. The same applies to the second intermediate saturation pulse Y2 in relation to the second readout block Z2 and the third readout block Z3. Alternatively, the duration B could be shorter than half of the repetition time period A and the duration C could be longer than half of the repetition time period A.

Figure 4:
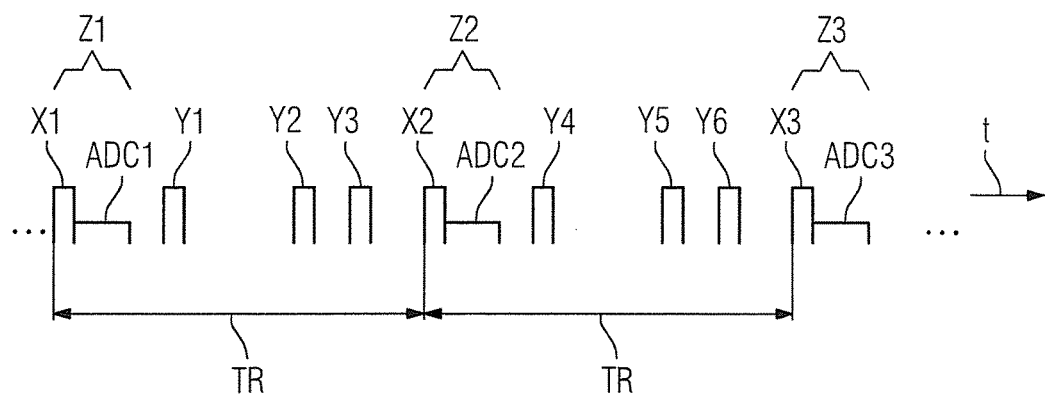
FIG. 4 shows an acquisition sequence according to a third embodiment of a method according to the invention.

FIG. 4 shows an acquisition sequence according to a third embodiment of a method according to the invention. The section of the acquisition sequence from FIG. 4 includes the same elements as the section of the acquisition sequence from FIG. 2 or FIG. 3. However, three intermediate saturation pulses Y1, Y2, Y3 take place between the first readout block Z2 and the second readout block Z2. Three additional intermediate saturation pulses Y4, Y5, Y6 take place between the second readout block Z2 and the third readout block Z3.

Figure 5:
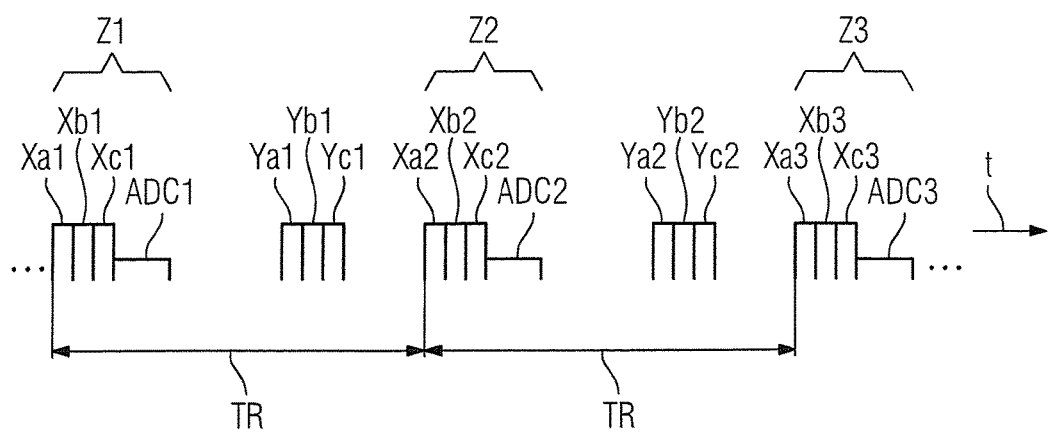
FIG. 5 shows an acquisition sequence according to a fourth embodiment of a method according to the invention.

FIG. 5 shows an acquisition sequence according to a fourth embodiment of a method according to the invention. As in FIGS. 2-4, three readout blocks Z1, Z2, Z3 again take place with a respective echo train ADC1, ADC2, ADC3. As an alternative to FIGS. 2-4, the readout blocks Z1, Z2, Z3 show three different readout saturation pulses Xa1, Xb1, Xc1, Xa2, Xb2, Xc2, Xa3, Xb3, Xc3. The first readout block Z1 thus includes three different first readout saturation pulses Xa1, Xb1, Xc1 etc. The three first readout saturation pulses Xa1, Xb1, Xc1 are respectively different from one another. For example, the three first readout saturation pulses Xa1, Xb1, Xc1 are different regional saturation pulses. Similarly, the three second readout saturation pulses Xa2, Xb2, Xc2 are different from one another, and the three third readout saturation pulses Xa3, Xb2, Xc3 are different from one another. However, the respective middle readout saturation pulses Xb1, Xb2, Xb3 are in turn similar across multiple readout blocks Z1, Z2, Z3, for example. Accordingly, three different intermediate saturation pulses Ya1, Yb1, Yc1, Ya2, Yb2, Yc2 also now respectively take place between the readout blocks Z1, Z2, Z3. These respectively correspond to the three different readout saturation pulses Xa1, Xb1, Xc1, Xa2, Xb2, Xc2, Xa3, Xb2, Xc3. For example, the middle intermediate saturation pulses Yb1, Yb2 are thus similar to the middle readout saturation pulses Xb1, Xb2, Xb3.

If, as occurs in conventional acquisition sequences (not shown), only readout saturation pulses X1, X2, X3 and no intermediate saturation pulses were to take place, the long wait time between the readout blocks Z1, Z2, Z3 would lead to an incomplete saturation of the tissue signals. The magnetic resonance images acquired with such conventional acquisition sequences would thus have an incompletely saturated tissue signal, and thus a low image quality.

In addition to the readout saturation pulses X1, X2, X3, the acquisition sequences shown in FIGS. 2-5 have intermediate saturation pulses Y1, Y2, Y3, Y4, Y5, Y6, Ya1, Yb1, Yc1, Ya2, Yb2, Yc2. The additional intermediate saturation pulses Y1, Y2, Y3, Y4, Y5, Y6, Ya1, Yb1, Yc1, Ya2, Yb2, Yc2 lead to the situation that a sufficient saturation of the tissue signals is present at the beginning of the respective echo trains ADC1, ADC2, ADC3. The magnetic resonance images acquired by means of the acquisition sequences shown in FIGS. 2-5 thus have a homogeneous and sufficiently saturated tissue signal across the desired region of effect of the regional saturation pulses, and thus have a high image quality.

The acquisition sequences of the method according to the invention that are shown in FIG. 2-5 are executed by the magnetic resonance apparatus 11. For this purpose, the magnetic resonance apparatus 11 includes the required software and/or computer programs that are stored in a memory unit of the magnetic resonance apparatus 11. The software and/or computer programs include program instructions (code) that are designed to execute the method according to the invention when the computer program and/or the software is executed in the magnetic resonance apparatus 11 by a processor of the magnetic resonance apparatus 11.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus, comprising:
   from a control computer, operating a magnetic resonance data acquisition unit, while an examination subject is situated in the magnetic resonance data acquisition unit, to acquire magnetic resonance data from the examination subject according to an acquisition sequence;
   from said control computer, in said acquisition sequence, operating said magnetic resonance apparatus to read out said magnetic resonance data with a readout block set comprising multiple readout blocks, a readout saturation pulse set comprising multiple readout saturation pulses, and an intermediate saturation pulse set comprising at least one intermediate saturation pulse, wherein said readout saturation pulse set is disjoint from said intermediate saturation pulse set, at least one readout block of said readout block set includes a readout saturation pulse of the readout saturation pulse set and at least one intermediate saturation pulse of the intermediate saturation pulse set occurs between two successive readout blocks of said readout block set; and
   from said control computer, entering the magnetic resonance data acquired from the examination subject with said acquisition sequence into an electronic memory, and making the magnetic resonance data entered into said electronic memory available at an output of the control computer in electronic form as a data file.

2. A method as claimed in claim 1 comprising, from said control computer in said acquisition sequence, operating said magnetic resonance apparatus with a repetition time that elapses between the respective beginnings of said two successive readout blocks of said readout block set, with half of said repetition time elapsing between the beginning of a chronologically first of said two successive readout blocks of the readout block set and said at least one intermediate saturation pulse of said intermediate saturation pulse set.

3. A method as claimed in claim 1 comprising, from said control computer in said acquisition sequence, operating said magnetic resonance apparatus with a repetition time between respective beginnings of said two successive readout blocks of said readout block set, with a duration that is longer than half of said repetition time, and shorter than said repetition time, elapsing between the beginning of a chronologically first readout block of said two successive readout blocks of said readout block set and said at least one intermediate saturation pulse of said intermediate saturation pulse set.

4. A method as claimed in claim 1 comprising, from said control computer in said acquisition sequence, operating said magnetic resonance apparatus with said intermediate saturation pulse set comprising multiple intermediate saturation pulses, with at least two of said intermediate saturation pulses occurring between said two successive readout blocks of said readout block set.

5. A method as claimed in claim 1 comprising, from said control computer in said acquisition sequence, operating said magnetic resonance apparatus with said readout saturation pulses of said readout saturation pulse set and said at least one intermediate saturation pulse of said intermediate saturation pulse set being similar to each other.

6. A magnetic resonance apparatus comprising:
   a magnetic resonance data acquisition unit;
   a control computer configured to operate said magnetic resonance data acquisition unit, while an examination subject is situated in the magnetic resonance data acquisition unit, to acquire magnetic resonance data from the examination subject according to an acquisition sequence;
   said control computer being configured, in said acquisition sequence, to operate said magnetic resonance apparatus to read out said magnetic resonance data with a readout block set comprising multiple readout blocks, a readout saturation pulse set comprising multiple readout saturation pulses, and an intermediate saturation pulse set comprising at least one intermediate saturation pulse, wherein said readout saturation pulse set is disjoint from said intermediate saturation pulse set, at least one readout block of said readout block set includes a readout saturation pulse of the readout saturation pulse set and at least one intermediate saturation pulse of the intermediate saturation pulse set occurs between two successive readout blocks of said readout block set;

an electronic memory; and said control computer being configured to enter the magnetic resonance data acquired from the examination subject with said acquisition sequence into said electronic memory, and to make the magnetic resonance data entered into said electronic memory available at an output of the control computer in electronic form as a data file.

7. A non-transitory, computer-readable data storage medium encoded with programming instructions, said data storage medium being loaded into a computerized control and processing system of a magnetic resonance apparatus that comprises a magnetic resonance data acquisition unit, and said programming instructions causing said computerized control and processing system to:

operate said magnetic resonance data acquisition unit, while an examination subject is situated in the magnetic resonance data acquisition unit, to acquire magnetic resonance data from the examination subject according to an acquisition sequence;

in said acquisition sequence, operate said magnetic resonance apparatus to read out said magnetic resonance data with a readout block set comprising multiple readout blocks, a readout saturation pulse set comprising multiple readout saturation pulses, and an intermediate saturation pulse set comprising at least one intermediate saturation pulse, wherein said readout saturation pulse set is disjoint from said intermediate saturation pulse set, at least one readout block of said readout block set includes a readout saturation pulse of the readout saturation pulse set and at least one intermediate saturation pulse of the intermediate saturation pulse set occurs between two successive readout blocks of said readout block set; and enter the magnetic resonance data acquired from the examination subject with said acquisition sequence into an electronic memory, and make the magnetic resonance data entered into said electronic memory available at an output of the control computer in electronic form as a data file.

\* \* \* \* \*